United States Patent [19]

Torelli et al.

[11] Patent Number: 4,580,063
[45] Date of Patent: Apr. 1, 1986

[54] CIRCUIT FOR THE PROTECTION OF IGFETS FROM OVERVOLTAGE

[75] Inventors: Guido Torelli, Pavia; Giovanni Salomone, Arenzano, both of Italy

[73] Assignee: SGS-ATES Componenti Elettronics S.p.A., Milan, Italy

[21] Appl. No.: 445,858

[22] Filed: Dec. 1, 1982

[30] Foreign Application Priority Data

Dec. 4, 1981 [IT] Italy .................... 25446 A/81

[51] Int. Cl.$^4$ .................... H02H 9/04; H03K 17/16; H03K 3/353; H03K 17/687
[52] U.S. Cl. ..................... 307/200 B; 307/363; 307/550; 307/559; 307/577; 340/662; 361/56; 361/91; 357/23.13
[58] Field of Search .................... 307/200 B, 443, 360, 307/363, 548, 549, 550, 554, 559, 568, 572, 574, 575, 577, 261, 304; 357/23 GP; 361/56, 90, 91, 92; 340/662, 663

[56] References Cited

U.S. PATENT DOCUMENTS

| | | | |
|---|---|---|---|
| 3,712,995 | 1/1973 | Steudel | 307/200 B X |
| 4,011,467 | 3/1977 | Shimada et al. | 307/200 B X |
| 4,160,923 | 7/1979 | Maeda et al. | 307/200 B X |
| 4,408,245 | 10/1983 | Pryor | 307/200 B X |
| 4,423,431 | 12/1983 | Sasaki | 357/41 |
| 4,449,158 | 5/1984 | Taira | 357/23.13 X |
| 4,481,521 | 11/1984 | Okumura | 357/41 X |
| 4,509,067 | 4/1985 | Minami et al. | 307/200 B X |

FOREIGN PATENT DOCUMENTS

| | | | |
|---|---|---|---|
| 116887 | 9/1979 | Japan | 357/23 GP |
| 136278 | 10/1979 | Japan | 357/23 GP |

Primary Examiner—Stanley D. Miller
Assistant Examiner—David R. Bertelson
Attorney, Agent, or Firm—Karl F. Ross; Herbert Dubno

[57] ABSTRACT

A pair of IGFETs connected in cascade across a d-c power supply form a source/drain junction constituting the output terminal of a self-biasing amplifier to which binary-coded bipolar signals are transmitted by way of a voltage divider effectively inserted between an input terminal and the afore-mentioned junction, a tap of that voltage divider being connected to the gate of a first of these IGFETs whose source is tied to one of the two supply terminals; the drain and the gate of the second IGFET are tied to the opposite supply terminal. A protective diode lies between the input terminal and the supply terminal connected to the source of the first IGFET so as to be reverse-biased by the voltage divider in a quiescent state and to break down in the presence of an abnormally high input voltage of a given polarity (positive in the specific instance described). An ancillary IGFET connected between the input terminal and the opposite supply terminal has its gate biased at a potential so chosen that this IGFET conducts in the presence of an input voltage of the other (negative) polarity approaching the forward-conduction threshold of the protective diode so as to prevent that threshold from being reached. The voltage divider may terminate at a source/drain junction of another pair of cascaded IGFETs that are identical with the IGFETs of the first pair and are connected in parallel therewith across the supply, the gate of the first IGFET of this other pair being tied to the last-mentioned source/drain junction which is also connected to the gate of the ancillary IGFET so as to bias same to the potential of the input and output terminals in the quiescent state in which the voltage divider is not traversed by any current.

10 Claims, 3 Drawing Figures

CIRCUIT FOR THE PROTECTION OF IGFETS FROM OVERVOLTAGE

FIELD OF THE INVENTION

Our present invention relates to integrated IGFET circuitry responsive to binary-coded incoming bipolar signals of widely varying amplitudes which are to be converted into amplitude-limited binary outgoing signals.

BACKGROUND OF THE INVENTION

Field-effect transistors of the insulated-gate type (IGFET) have a high input impedance and are therefore particularly suitable for amplifying or otherwise processing incoming signals of the binary-coded type whose basic configuration must be preserved. However, the small capacitance existing between the insulated gate and the substrate of an IGFET is conducive to a breakdown of the intervening insulation even upon accumulation of minor charges on the gate. In order to prevent such a breakdown, it has become customary to combine such an IGFET with a Zener-type diode—formed in the same substrate—which is reverse-biased by the signal voltage (assumed to be unipolar in nature) but breaks down when that voltage exceeds a level that can be safely tolerated by the gate/substrate assembly.

As pointed out in U.S. Pat. No. 3,934,159, such a protective diode may become troublesome if the input voltage is not strictly unipolar but is overlain by parasitic oscillations which could bias the diode in its forward direction with resulting injection of minority carriers into the common substrate. The solution offered by that U.S. patent involves the provision of a second diode which is connected in parallel with the first one but does not share the substrate of the IGFET and which conducts in response to an inverted voltage before that voltage reaches the threshold at which minority carriers would begin to pass through the first diode.

The required physical isolation of the second diode from the common substrate of the first diode and of the IGFET protected thereby necessitates the use of different semiconductor bodies or the separation of the two diodes from each other by a cut in the substrate of such a body. The need for two distinct components in the first instance is a drawback where compactness is an important consideration; the additional operation of producing a gap is inconvenient in the second instance.

OBJECTS OF THE INVENTION

The general object of our present invention, therefore, is to provide an improved circuit arrangement for the protection of an IGFET from overvoltages with avoidance of the disadvantages referred to.

A more particular object is to provide a circuit arrangement of this description effective with incoming signals of bipolar character.

SUMMARY OF THE INVENTION

A circuit arrangement according to our invention comprises a processing stage with two branches respectively including a first and second IGFET which are connected in cascade across a direct-current supply. The first IGFET has a source connected to one supply terminal, generally the one which is joined to the common substrate, while the second IGFET has a gate and a drain connected to the other supply terminal; a drain of the first IGFET and a source of the second IGFET are jointly connected to an output terminal energizable with outgoing signals which are derived from bipolar incoming signals arriving at an input terminal. A gate of the first IGFET is connected to a tap of a voltage divider which is inserted between the input terminal and a junction of the two branches, this junction having a mean voltage intermediate the potentials of the two supply terminals; in a quiescent state, in which that voltage divider is not traversed by any current, the mean voltage of the branch junction is also present at the divider tap connected to the gate of the first IGFET which thereby establishes a predetermined reference potential on the output terminal connected to its drain. A protective diode is inserted, as known per se, between the input terminal and the supply terminal tied to the source of the first IGFET so as to be reverse-biased in the quiescent state and to break down in the presence of an abnormally high incoming signal of a certain polarity, namely the polarity of the other supply terminal which is tied to the source of the second IGFET; in the embodiments particularly described hereinafter, that polarity is assumed to be positive (as is that of the mean voltage at the branch junction). An ancillary IGFET has a source connected to the input terminal, a drain connected to that other supply terminal and a gate connected to a point of biasing potential which maintains this IGFET nonconductive except in the presence of an incoming signal of the opposite polarity (negative in the embodiments described hereinafter) approaching a forward-conduction threshold of the protective diode; the conductivity of the ancillary IGFET upon such approach is sufficient to prevent that threshold from being reached.

The mean voltage of the branch junction, which is also present on the input terminal in the quiescent state, allows the input voltage to swing in the direction of the opposite polarity (negative) with an amplitude somewhat exceeding that mean voltage before the protective diode becomes forwardly conductive. We therefore may peg the gate potential of the ancillary IGFET to the mean voltage of the branch junction which preferably is made to equal the reference potential established in the quiescent state at the output terminal. Such equality will exist if that branch junction coincides with the source/drain junction of the cascaded first and second IGFETs or if, according to a further feature of our invention, two other cascaded IGFETs substantially duplicating same are connected in parallel therewith across the supply terminals as more fully described hereinafter. The pair or pairs of cascaded IGFETs, the ancillary IGFET and the protective diode can be readily integrated into a compact unit with a common substrate without requiring any additional manufacturing step after the formation of the several constituents by the usual ion-implantation technique.

BRIEF DESCRIPTION OF THE DRAWING

The above and other features of our invention will now be described in detail with reference to the accompanying drawing in which.

SPECIFIC DESCRIPITON

Figure 1:
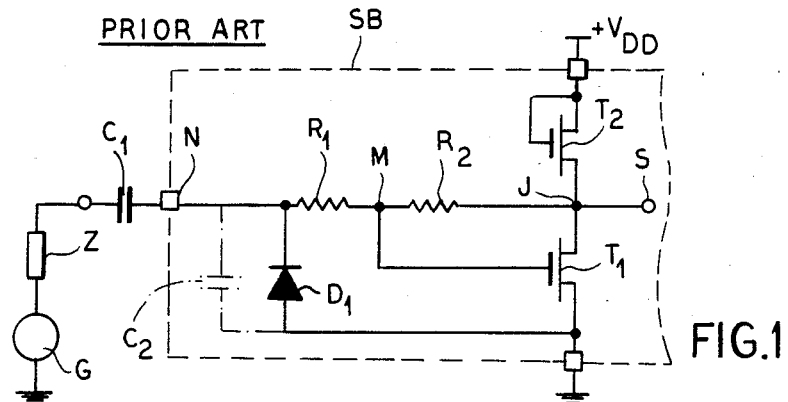
FIG. 1 is a circuit diagram of a pair of cascaded IGFETs and a protective diode conventionally associated therewith in an integrated module which is capacitively coupled to a generator of binary-coded bipolar input signals.

FIG. 1 shows a prior-art circuit arrangement of the type to which our invention is applicable. Two cascaded IGFETs $T_1$ and $T_2$ are incorporated in a silicon substrate SB of p-type conductivity connected to the grounded negative terminal of a d-c supply also having a positive terminal $+V_{DD}$. IGFET $T_1$ has a source grounded at the negative supply terminal and a drain forming a junction J with a source of IGFET $T_2$, that junction being directly connected to an output terminal S. A drain and an insulated gate of IGFET $T_2$ are tied to the positive supply terminal $+V_{DD}$ whereby this IGFET is operated as an enhancement-type n-channel field-effect transistor. This IGFET acting as a load of main transistor $T_1$, could also be operated in the depletion mode if its gate were connected to junction J (i.e. to its drain electrode) rather than to supply terminal $+V_{DD}$ (i.e. to its source electrode). The drain and source electrodes of the IGFETs are formed by n-doped enclaves in the substrate overlain by metallic plates as is well known in the art.

An input terminal N is connected to junction J by way of a voltage divider consisting of two series resistors $R_1$ and $R_2$, a tap M formed by the junction of these resistors being tied to the gate of IGFET $T_1$ which is thereby also operated as an enhancement-type n-channel field-effect transistor. A protective diode DI has its cathode connected to input terminal N and has its anode grounded so as to be reverse-biased in a quiescent state in which no current traverses the voltage divider $R_1$, $R_2$ whereby points N, M, J and S are all at the same mean positive voltage constituting a reference potential $V_R$; with proper design of the circuit elements, this reference potential $V_R$—lying substantially midway between ground and the potential of supply terminal $+V_{DD}$—defines a point of maximum gain for the amplifier stage constituted by the two IGFETs. There is also indicated at $C_2$ a virtual capacitor which lies in parallel with diode DI and represents the input capacitance of the integrated circuitry constituted by the aforedescribed components incorporated in substrate SB. Other components also integrated into that substrate, driven by outgoing signals on output terminal S, have not been illustrated.

Input terminal N is coupled through a capacitor $C_1$ to a generator G of incoming signals having an internal impedance Z, as diagrammatically illustrated. Generator G, when active, is assumed to emit bipolar pulses which may widely vary in amplitude and which, when of positive polarity, may exceed the Zener threshold of diode DI when added to the reference potential $V_R$. Such a breakdown of diode DI will protect the IGFET $T_1$ against excessive positive gate voltages; however, negative pulses surpassing that reference potential may drive the diode DI into forward conduction, thereby resulting in the injection of minority carriers (electrons) into the substrate with the art-recognized disadvantages discussed for example in the above-cited U.S. Pat. No. 3,934,159. A typical instance of such a generator of amplitude-varying pulses would be a device for the remote control of a television receiver, that device comprising a photoelectric transducer responsive to infrared rays emitted by a manual controller; the transducer works into a preamplifier producing pulses whose amplitudes depend on the distance from the controller and which constitute a binary code identifying a selected TV channel. The cascaded IGFETs $T_1$ and $T_2$ form a self-biasing amplifier/limiter and inverter stage feeding nonillustrated further stages which operate the channel selector of the TV receiver.

Figure 2:
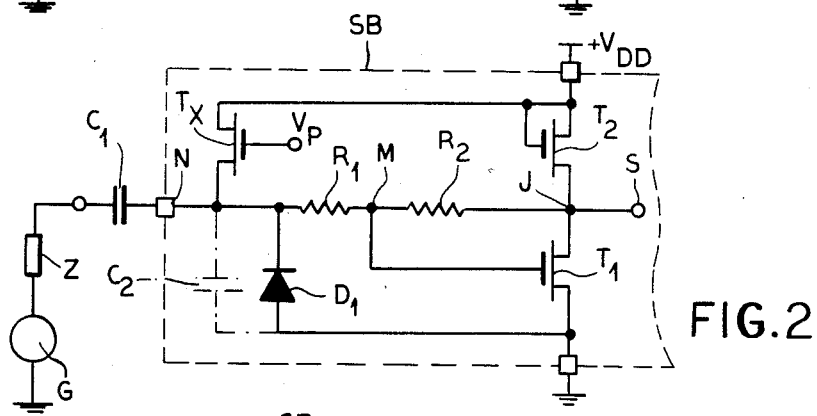
FIG. 2 is a circuit diagram similar to that of FIG. 1 but showing the module expanded to include an ancillary IGFET according to our present improvement.

In accordance with our present improvement, and as illustrated in FIG. 2, the circuitry of FIG. 1 is supplemented by an ancillary IGFET $T_x$ having its source tied to input terminal N, its drain tied to positive supply terminal $+V_{DD}$ and its gate connected to a point of fixed potential $V_p$. The latter potential is so chosen that IGFET $T_x$ will be normally cut off and will conduct only when the voltage of terminal N goes sufficiently negative to approach the forward-conduction threshold of diode DI. On being thus turned on by a voltage difference $V_P - V_T$, with $V_T$ representing a threshold voltage appearing on input terminal N, IGFET $T_x$ will be sufficiently conductive to prevent the input voltage from reaching a forward-conduction threshold of diode DI. This will clip an incoming negative-going pulse but will not mutilate a received binary code as long as the clipping level lies sufficiently below reference level $V_R$ to give rise to a definite positive-going pulse on output terminal S. Since diode DI will not become forwardly conducting until the input voltage has gone negative with reference to ground, a suitable negative swing of that input voltage will be available by making the gate voltage $V_P$ equal to the reference potential $V_R$.

Figure 3:
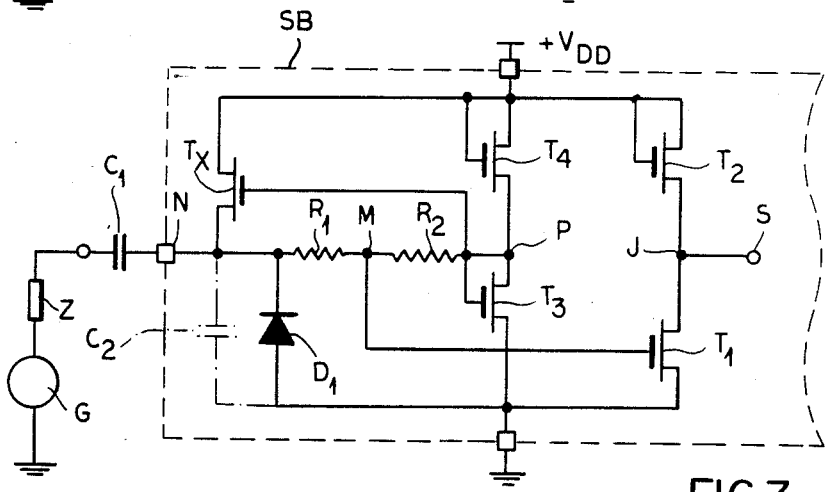
FIG. 3 is another circuit diagram similar to that of FIG. 1, showing a second pair of cascaded IGFETs included in the module.

In FIG. 3 we have illustrated a modification of the circuit arrangement of FIG. 2 by which such equality of voltages $V_P$ and $V_R$ is achieved. In this system a second pair of cascaded IGFETs $T_3$ and $T_4$ are connected in parallel with IGFETs $T_1$ and $T_2$ between ground and supply terminal $+V_{DD}$; IGFET $T_3$, which is a substantial duplicate of IGFET $T_1$, has its drain connected at a point P to the source of IGFET $T_4$ which is a substantial duplicate of IGFET $T_2$ and, like the latter, has its gate and drain connected to the terminal $+V_{DD}$. The gate of IGFET $T_3$, however, is connected to the fixed-potential point P which constitutes another junction, separated from junction J, between circuit branches $T_1$, $T_3$ and $T_2$, $T_4$. Voltage divider $R_1$, $R_2$ terminates in this instance at junction point P which is also connected to the gate of ancillary IGFET $T_x$ so as to provide same with the biasing potential $V_P = V_R$. The gate of IGFET $T_1$ is connected, as before, to the tap M of the voltage divider.

In the quiescent state, in which no current passes through resistors $R_1$ and $R_2$, input terminal N and tap M are at the same biasing potential $V_P$ so that the gates of IGFETs $T_1$ and $T_3$ also have the same bias. Thanks to the substantial identity of the two IGFET pairs, junction J is maintained in that instance at the potential $V_P = V_R$ which is also present on output terminal S.

It will be understood that, with suitable inversion of polarity of the power supply, the conductivity types of the substrate and of the source and drain electrodes of the several IGFETs as well as of the p/n junction forming the diode DI can be interchanged.

We claim:

1. A circuit arrangement for converting bipolar incoming signals of widely varying amplitudes into amplitude-limited binary outgoing signals, comprising
a processing stage with two branches, a first branch including a first IGFET and a second branch including a second IGFET connected in cascade across a direct-current supply, said first IGFET having a source connected to one supply terminal, said second IGFET having a gate and a drain connected to the other supply terminal, a drain of said first IGFET and a source of said second IGFET being jointly connected to an output terminal supplied with said outgoing signals;
an input terminal coupled to a generator of said incoming signals;
a voltage divider inserted between said input terminal and said output terminal having a mean voltage intermediate the potentials of said supply terminals, said first IGFET having a gate connected to a tap of said voltage divider for establishing a predetermined reference potential on said output terminal in a quiescent state;
a protective diode inserted between said input terminal and said one supply terminal so as to be reverse-biased in said quiescent state and to break down in the presence of an abnormally high incoming signal of a certain polarity; and
an ancillary IGFET with a source connected to said input terminal, a drain connected to said other supply terminal and a gate connected to a point of biasing potential maintaining said ancillary IGFET nonconductive except in the presence of an incoming signal of the opposite polarity approaching a forward-conduction threshold of said protective diode, the conductivity of said ancillary IGFET upon such approach being sufficient to prevent said threshold from being reached, wherein said biasing potential substantially equals said reference potential.

2. A circuit arrangement for converting bipolar incoming signals of widely varying amplitudes into amplitude-limited binary outgoing signals,
comprising:
a processing stage with two branches, the first branch including a first IGFET and a second branch including a second IGFET connected in cascade across a direct-current supply, said first IGFET having a source connected to one supply terminal, said second IGFET having a gate and a drain connected to the other supply terminal, a drain of said first IGFET and a source of said second IGFET being jointly connected to an output terminal supplied with said outgoing signals, wherein said processing stage further includes a third and a fourth IGFET connected in cascade across said direct-current supply, said third IGFET having a source connected to said one supply terminal, said fourth IGFET having a gate and a drain connected to said other supply terminal, a gate and a drain of said third IGFET forming said junction with a source of said fourth IGFET, said gate and said drain of said third IGFET being connected to a voltage divider, said gate and said drain of said third IGFET being further connected with a gate of an ancillary IGFET, said third and fourth IGFETS being substantial duplicates of said first and second IGFETS, respectively, whereby said junction and said input and output terminals are maintained at substantially identical potentials in said quiescent state;
an input terminal coupled to a generator of said incoming signals;
said voltage divider inserted between said input terminal and said output terminal having a mean voltage intermediate the potentials of said supply terminals, said first IGFET having a gate connected to a tap of said voltage divider for establishing a predetermined reference potential on said output terminal in a quiescent stage;
a protective diode inserted between said input terminal and said one supply terminal so as to be reverse-biased in said quiescent state and to break down in the presence of an abnormally high incoming signal of a certain polarity; and
said ancillary IGFET with a source connected to said input terminal, a drain connected to said other supply terminal and a gate connected to a point of biasing potential maintaining said ancillary IGFET nonconductive except in the presence of an incoming signal of the opposite polarity approaching a forward-conduction threshold of said protective diode, the conductivity of said ancillary IGFET upon such approach being sufficient to prevent said threshold from being reached.

3. A circuit arrangement of converting bipolar incoming signals of widely varying amplitudes into amplitude-limited binary outgoing signals,
comprising:
a processing stage with two branches, a first branch including a first IGFET and a second branch including a second IGFET connected in cascade across a direct-current supply, said first IGFET having a source connected to one supply terminal, said second IGFET having a gate and a drain connected to the other supply terminal, a drain of said first IGFET and a source of said second IGFET being jointly connected to an output terminal supplied with said outgoing signals, wherein said processing stage further includes a third and a fourth IGFET connected in cascade across said direct-current supply, said third IGFET having a source connected to said one supply terminal, said fourth IGFET having a gate and a drain connected to said other supply terminal, a gate and a drain of said third IGFET forming said junction with a source of said fourth IGFET, said gate and said drain of said third IGFET being connected to a voltage divider, said gate and said drain of said IGFET being further connected with a gate of an ancillary IGFET, said third and fourth IGFETS being substantial duplicates of said first and second IGFETS, respectively, whereby said junction and said input and output terminals are maintained at substantially identical potentials in said quiescent state;
an input terminal coupled to a generator of said incoming signals;
said voltage divider inserted between said input terminal and said output terminal having a mean voltage intermediate the potentials of said supply terminals, said first IGFET having a gate connected to a tap of said voltage divider for establishing a predetermined reference potential on said output terminal in a quiescent state;
a protective diode inserted between said input terminal and said one supply terminal so as to be reverse-biased in said quiescent state and to break down in the presence of an abnormally high incoming signal of a certain polarity; and said ancillary IGFET with a source connected to said input terminal, a drain connected to said other supply terminal and a gate connected to a point of biasing potential maintaining said ancillary IGFET nonconductive except in the presence of an incoming signal of the opposite polarity approaching a forward-conduction threshold of said protective diode, the conductivity of said ancillary IGFET upon such approach being sufficient to prevent said threshold from being reached, said first, second, third and fourth IGFETS, said voltage divider, said protective diode and said ancillary IGFET are part of an integrated circuit with a substrate connected to said one supply terminal.

4. A circuit arrangement as defined in claim 1 wherein said first and second IGFETS, said voltage divider, said protective diode and said ancillary IGFET are part of an integrated circuit with a substrate connected to said one supply terminal.

5. A circuit arrangement for converting bipolar incoming signals of widely varying amplitude into amplitude-limited bipolar outgoing signals, comprising:

a processing stage including a main IGFET connected in series with a load across a direct-current supply, said main IGFET having a source connected to one supply terminal and a drain connected to an output terminal;

an input terminal coupled to a generator of said incoming signals;

a voltage divider inserted between said input and output terminals, said main IGFET having a gate connected to a tap of said voltage divider for establishing a predetermined reference potential on said output terminal in a quiescent state;

a protective diode inserted between said input terminal and said one supply terminal, so as to be reverse-biased in said quiescent state and to break down in the presence of an abnormally high incoming signal of a certain polarity; and an ancillary IGFET with a source connected to said input terminal, a drain connected to said other supply terminal and a gate connected to a point of biasing potential substantially equal to said reference potential.

6. A circuit arrangement as defined in claim 5, wherein said load comprises another IGFET with a drain electrode connected to said other supply terminal, a source electrode connected to said output terminal and a gate connected to one of said drain and source electrodes.

7. A circuit arrangement as defined in claim 5 wherein said main IGFET, said load, said voltage divider, said protective diode and said ancillary IGFET are part of an integrated circuit with a substrate connected to said one supply terminal.

8. A circuit arrangement for converting bipolar incoming signals of widely varying amplitude into amplitude-limited bipolar outgoing signals, comprising:

a processing stage including a first main IGFET connected in series with a first load across a direct-current supply, said first main IGFET having a source connected to one supply terminal and a drain connected to an output terminal;

said processing stage further including a second main IGFET connected in series with a second load across said direct-current supply, said second main IGFET having a source connected to said one supply terminal;

an input terminal coupled to a generator of said incoming signals;

a voltage divider inserted between said input terminal and a junction between said second load and a drain of said second main IGFET, said second main IGFET having a gate connected to a tap of said voltage divider for establishing a predetermined reference potential on said junction in a quiescent state, said second main IGFET and said second load being substantial duplicates of said first main IGFET and said first load, respectively, whereby said junction and said input and output terminals are maintained at substantially identical potentials in said quiescent state;

a protective diode inserted between said input terminal and said one supply terminal, so as to be reverse-biased in said quiescent state and to break down in the presence of an abnormally high incoming signal of a certain polarity; and an ancillary IGFET with a source connected to said input terminal, a drain connected to said other supply terminal and a gate connected to a point of biasing potential substantially equal to said reference potential.

9. A circuit arrangement as defined in claim 8, wherein said first load comprises a first IGFET with a drain electrode connected to said other supply terminal, a source electrode connected to said output terminal and a gate electrode to one of said electrodes; and wherein said second load comprises a second IGFET with a drain electrode connected to said other supply terminal, a source electrode connected to said junction and a gate electrode connected to one of said drain and source electrodes of said second IGFET.

10. A circuit arrangement as defined in claim 8, wherein said first and second main IGFET, said first and second loads, said voltage divider, said protective diode and said ancillary IGFET are part of an integrated circuit with a substrate connected to said one supply terminal.

* * * * *